(12) United States Patent
Bellorado et al.

(10) Patent No.: US 10,496,559 B1
(45) Date of Patent: Dec. 3, 2019

(54) DATA PATH DYNAMIC RANGE OPTIMIZATION

(71) Applicant: Seagate Technology LLC, Cupertino, CA (US)

(72) Inventors: Jason Bellorado, San Jose, CA (US); Marcus Marrow, San Jose, CA (US); Zheng Wu, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/729,139

(22) Filed: Oct. 10, 2017

Related U.S. Application Data

(60) Provisional application No. 62/522,248, filed on Jun. 20, 2017.

(51) Int. Cl.
| | | |
|---|---|---|
| *G06F 13/10* | (2006.01) | |
| *G06F 13/42* | (2006.01) | |
| *H03G 3/20* | (2006.01) | |
| *H03M 1/12* | (2006.01) | |

(52) U.S. Cl.
CPC ........ *G06F 13/102* (2013.01); *G06F 13/4221* (2013.01); *H03G 3/20* (2013.01); *H03M 1/12* (2013.01)

(58) Field of Classification Search
CPC ............................ G06F 13/102; G06F 13/4221
See application file for complete search history.

(56) References Cited

U.S. PATENT DOCUMENTS

| | | | |
|---|---|---|---|
| 5,321,564 A | 6/1994 | Takahashi | |
| 5,742,532 A | 4/1998 | Duyne et al. | |
| 5,970,093 A | 10/1999 | Lantremange | |
| 6,157,510 A | 12/2000 | Schreck et al. | |
| 6,320,920 B1 | 11/2001 | Beyke | |
| 6,377,552 B1 | 4/2002 | Moran | |
| 6,670,901 B2 | 12/2003 | Brueske et al. | |
| 6,687,073 B1 | 2/2004 | Kupferman | |
| 6,697,891 B2 | 2/2004 | Emberty et al. | |
| 6,707,772 B1 * | 3/2004 | Marrec | G11B 7/0901 369/44.34 |
| 6,738,215 B2 | 5/2004 | Yatsu | |
| 6,950,258 B2 | 9/2005 | Takaishi | |

(Continued)

OTHER PUBLICATIONS

Bellorado et al., "Target Parameter Adaptation", U.S. Appl. No. 15/334,167, filed Oct. 25, 2016, Seagate Technology LLC.

*Primary Examiner* — Nimesh G Patel

(74) *Attorney, Agent, or Firm* — Setter Roche LLP; Kirk A. Cesari

(57) ABSTRACT

Systems and methods are disclosed for full utilization of a data path's dynamic range. In certain embodiments, an apparatus may comprise a circuit including a first filter to digitally filter and output a first signal, a second filter to digitally filter and output a second signal, a summing node, and a first adaptation circuit. The summing node combine the first signal and the second signal to generate a combined signal at a summing node output. The first adaptation circuit may be configured to receive the combined signal, and filter the first signal and the second signal to set a dynamic amplitude range of the combined signal at the summing node output by modifying a first coefficient of the first filter and a second coefficient of the second filter based on the combined signal.

20 Claims, 11 Drawing Sheets

(56) References Cited

U.S. PATENT DOCUMENTS

| | | |
|---|---|---|
| 6,993,291 B2 | 1/2006 | Parssinen et al. |
| 7,046,701 B2 | 5/2006 | Mohseni et al. |
| 7,133,233 B1 | 11/2006 | Ray et al. |
| 7,245,448 B2 | 7/2007 | Urata |
| 7,298,573 B2 | 11/2007 | Kitamura |
| 7,324,437 B1 | 1/2008 | Czylwik et al. |
| 7,362,432 B2 | 4/2008 | Roth |
| 7,940,667 B1 | 5/2011 | Coady |
| 8,139,301 B1 | 3/2012 | Li et al. |
| 8,172,755 B2 | 5/2012 | Song et al. |
| 8,400,726 B1 | 3/2013 | Wu et al. |
| 8,441,751 B1 | 5/2013 | Song et al. |
| 8,456,977 B2 | 6/2013 | Honma |
| 8,479,086 B2 | 7/2013 | Xia et al. |
| 8,514,506 B1 | 8/2013 | Li et al. |
| 8,539,328 B2 | 9/2013 | Jin et al. |
| 8,542,766 B2 | 9/2013 | Chekhovstov et al. |
| 8,713,413 B1 | 4/2014 | Bellorado et al. |
| 8,755,139 B1 | 6/2014 | Zou et al. |
| 8,760,794 B1 | 6/2014 | Coker et al. |
| 8,837,068 B1 | 9/2014 | Liao et al. |
| 8,861,111 B1 | 10/2014 | Liao et al. |
| 8,861,112 B1 | 10/2014 | Pan et al. |
| 8,953,276 B1 | 2/2015 | Pokharel |
| 9,007,707 B1 | 4/2015 | Lu et al. |
| 9,019,642 B1 | 4/2015 | Xia et al. |
| 9,064,537 B1 | 6/2015 | Nie |
| 9,082,418 B2 | 7/2015 | Ong et al. |
| 9,093,115 B1 | 7/2015 | Fung et al. |
| 9,099,132 B1 * | 8/2015 | Grundvig ............. G11B 5/4886 |
| 9,129,650 B2 | 9/2015 | Mathew et al. |
| 9,147,416 B2 | 9/2015 | Grundvig et al. |
| 9,196,298 B1 | 11/2015 | Zhang et al. |
| 9,245,579 B2 * | 1/2016 | Song ................ G11B 20/10046 |
| 9,245,580 B1 | 1/2016 | Lu et al. |
| 9,257,135 B2 | 2/2016 | Ong et al. |
| 9,286,915 B1 | 3/2016 | Dziak et al. |
| 9,311,937 B2 | 4/2016 | Zou et al. |
| 9,401,161 B1 * | 7/2016 | Jury ..................... G11B 5/3974 |
| 9,424,878 B1 | 8/2016 | Dziak et al. |
| 9,431,052 B2 * | 8/2016 | Oberg ............. G11B 20/10037 |
| 9,508,369 B2 | 11/2016 | Chu et al. |
| 9,542,972 B1 | 1/2017 | Nayak et al. |
| 9,564,157 B1 | 2/2017 | Trantham |
| 9,590,803 B2 | 3/2017 | Derras et al. |
| 9,672,850 B2 | 6/2017 | Grundvig et al. |
| 9,728,221 B2 | 8/2017 | Oberg et al. |
| 9,947,362 B1 | 4/2018 | Venkataramani et al. |
| 2002/0181439 A1 | 12/2002 | Orihashi et al. |
| 2003/0198165 A1 * | 10/2003 | Mouri ............. G11B 20/10009<br>369/53.35 |
| 2009/0141386 A1 * | 6/2009 | Miura ..................... G11B 5/09<br>360/46 |
| 2010/0290153 A1 | 11/2010 | Hampshire |
| 2011/0090773 A1 | 4/2011 | Yu et al. |
| 2011/0176400 A1 | 7/2011 | Gerasimov |
| 2012/0105994 A1 | 5/2012 | Bellorado et al. |
| 2012/0155577 A1 | 6/2012 | Shukla et al. |
| 2016/0187961 A1 * | 6/2016 | Elibol ................... G06F 1/3293<br>713/323 |
| 2017/0249206 A1 | 8/2017 | Jeong et al. |

* cited by examiner

DATA PATH DYNAMIC RANGE OPTIMIZATION

CROSS-REFERENCE TO RELATED APPLICATION

The present application is a non-provisional application of and claims priority to U.S. provisional patent application, Application No. 62/522,248, filed Jun. 20, 2017, entitled "MISO Systems and Methods", the contents of which are hereby incorporated by reference in their entirety.

SUMMARY

In certain embodiments, an apparatus may comprise a circuit including a first filter to digitally filter and output a first signal, a second filter to digitally filter and output a second signal, a summing node, and a first adaptation circuit. The summing node may include a first input to receive the first signal from the first filter, a second input to receive the second signal from the second filter, and a summing node output, with the summing node configured to combine the first signal and the second signal to generate a combined signal at the summing node output. The first adaptation circuit may be configured to receive the combined signal, and filter the first signal and the second signal to set a dynamic amplitude range of the combined signal at the summing node output by modifying a first coefficient of the first filter and a second coefficient of the second filter based on the combined signal.

In certain embodiments, an apparatus may comprise a data channel circuit including a first analog front end (AFE) configured to process a first signal, a first analog to digital converter (ADC) configured to receive the first signal from the first AFE and to digitize the first signal, and a first adaptation circuit configured to adapt the dynamic amplitude range of the first signal at the first ADC by adjusting a signal gain at the first AFE based on the first signal output from the first ADC.

DETAILED DESCRIPTION

In the following detailed description of certain embodiments, reference is made to the accompanying drawings which form a part hereof, and in which are shown by way of illustration of example embodiments. It is also to be understood that features of the embodiments and examples herein can be combined, exchanged, or removed, other embodiments may be utilized or created, and structural changes may be made without departing from the scope of the present disclosure.

In accordance with various embodiments, the methods and functions described herein may be implemented as one or more software programs running on a computer processor or controller. Dedicated hardware implementations including, but not limited to, application specific integrated circuits, programmable logic arrays, and other hardware devices can likewise be constructed to implement the methods and functions described herein. Methods and functions may be performed by modules, which may include one or more physical components of a computing device (e.g., logic, circuits, processors, etc.) configured to perform a particular task or job, or may include instructions that, when executed, can cause a processor to perform a particular task or job, or any combination thereof. Further, the methods described herein may be implemented as a computer readable storage medium or memory device including instructions that, when executed, cause a processor to perform the methods.

Figure 1:
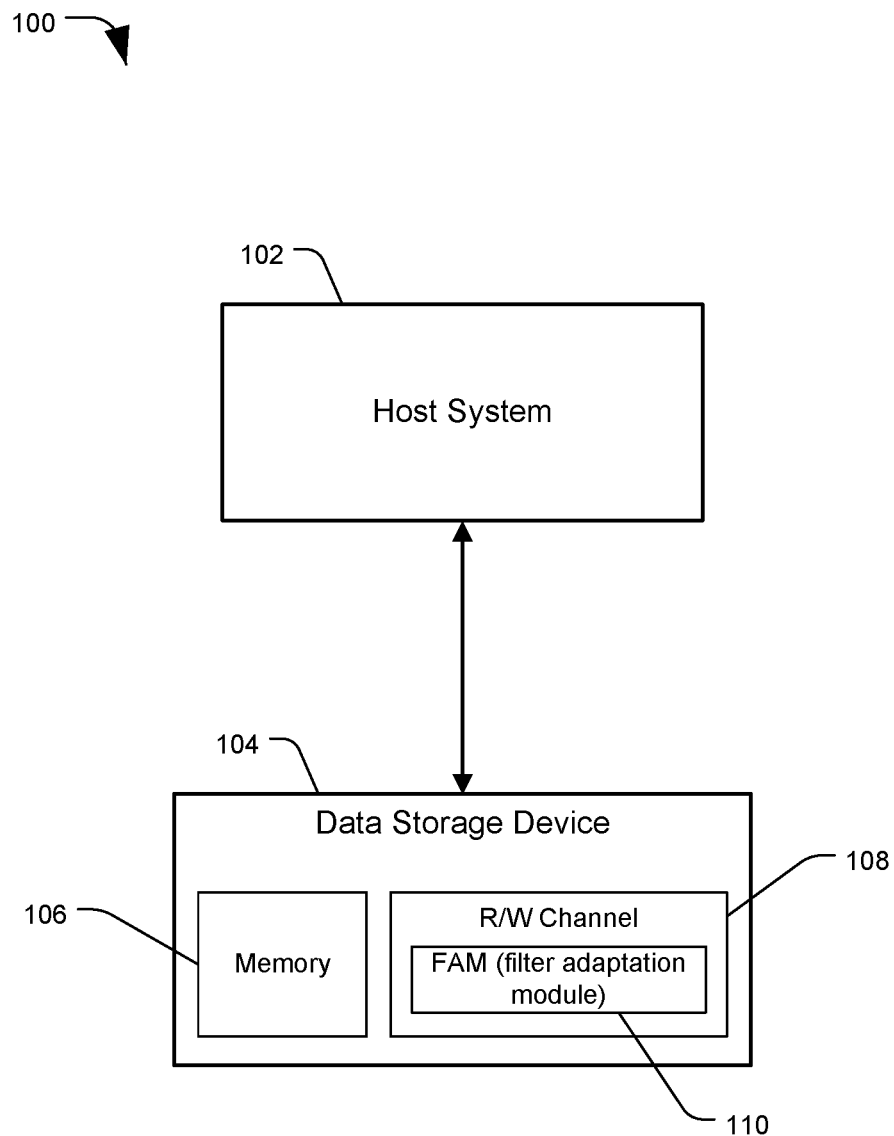
FIG. 1 is a diagram of a system configured for data path dynamic range optimization, in accordance with certain embodiments of the present disclosure.

FIG. 1 is a diagram of a system configured for data path dynamic range optimization, generally designated 100, in accordance with certain embodiments of the present disclosure. The system 100 may include a host 102 and a data storage device (DSD) 104. The host 102 may also be referred to as the host system or host computer. The host 102 can be a desktop computer, a laptop computer, a server, a tablet computer, a telephone, a music player, another electronic device, or any combination thereof. Similarly, the DSD 104 may be any of the above-listed devices, or any other device which may be used to store or retrieve data, such as a hard disc drive (HDD). The host 102 and DSD 104 may be connected by way of a wired or wireless connection, or by a local area network (LAN) or wide area network (WAN). In some embodiments, the DSD 104 can be a stand-alone device not connected to a host 102 (e.g. a removable data storage device having its own case or housing), or the host 102 and DSD 104 may both be part of a single unit (e.g. a computer having an internal hard drive).

The DSD 104 may include a memory 106 and a read/write (R/W) channel 108. The memory 106 may include a nonvolatile data storage medium, such as solid state flash memory, a magnetic storage medium such as a hard disc, other nonvolatile storage mediums, or any combination thereof. The R/W channel 108 may comprise one or more circuits or processors configured to process signals for recording to or reading from the memory 106. During operation, the DSD 104 may receive a data access request, such as a read or write request, from the host device 102. In response, the DSD 104 may perform data access operations on the memory 106 via the R/W channel 108 based on the request.

The DSD 104 may retrieve data from the memory 106 as one or more analog signals, e.g. using one or more receivers, such as reader elements or heads, to detect magnetic signals from tracks of a disc. In an example embodiment, the DSD 104 may be a multi-sensor magnetic recording (MSMR) system, which may use multiple reader elements over a single storage media surface to sense the magnetic field from the same track of the media simultaneously during a read operation. The R/W channel 108 may perform processing on the analog signal(s) to detect a digital bit sequence representing stored data. In an MSMR system, the signals detected from different heads can be combined in the R/W channel 108 to achieve a better performance of recovering the recorded signal (e.g. resulting in a lower bit error rate (BER)) than using a single head.

The data path of the R/W channel 108 may have a dynamic amplitude range, such that the amplitude of a signal at the output of various components can be modified by adjusting settings of those components. Various components of the R/W channel 108 may have an optimum amplitude range at their inputs for the signal(s) being processed. As such, a conditioning process applied by the R/W channel 108 to the signal(s) must appropriately set the signal amplitude to avoid excessive quantization, as would be the case if the signal amplitude were too small, and to avoid excessing saturation, as would be the case if the amplitude were too large. By appropriately setting the signal amplitude at various points along the R/W channel 108, the degradation caused by quantization and saturation may be avoided.

Accordingly, DSD 104 may include one or more filter adaptation modules (FAMs) 110, located within the R/W channel 108. The FAM 110 may perform the methods and processes described herein to adjust signal amplitude within the R/W channel 108 in order to fully use the data path's dynamic range and maintain peak signal quality and channel performance. In this manner, the functioning of the DSD 104 may be improved by increasing the R/W channel's ability to accurately determine a bit pattern from a detected analog signal. An example arrangement of some elements from a R/W channel is depicted in regard to FIG. 2.

Figure 2:
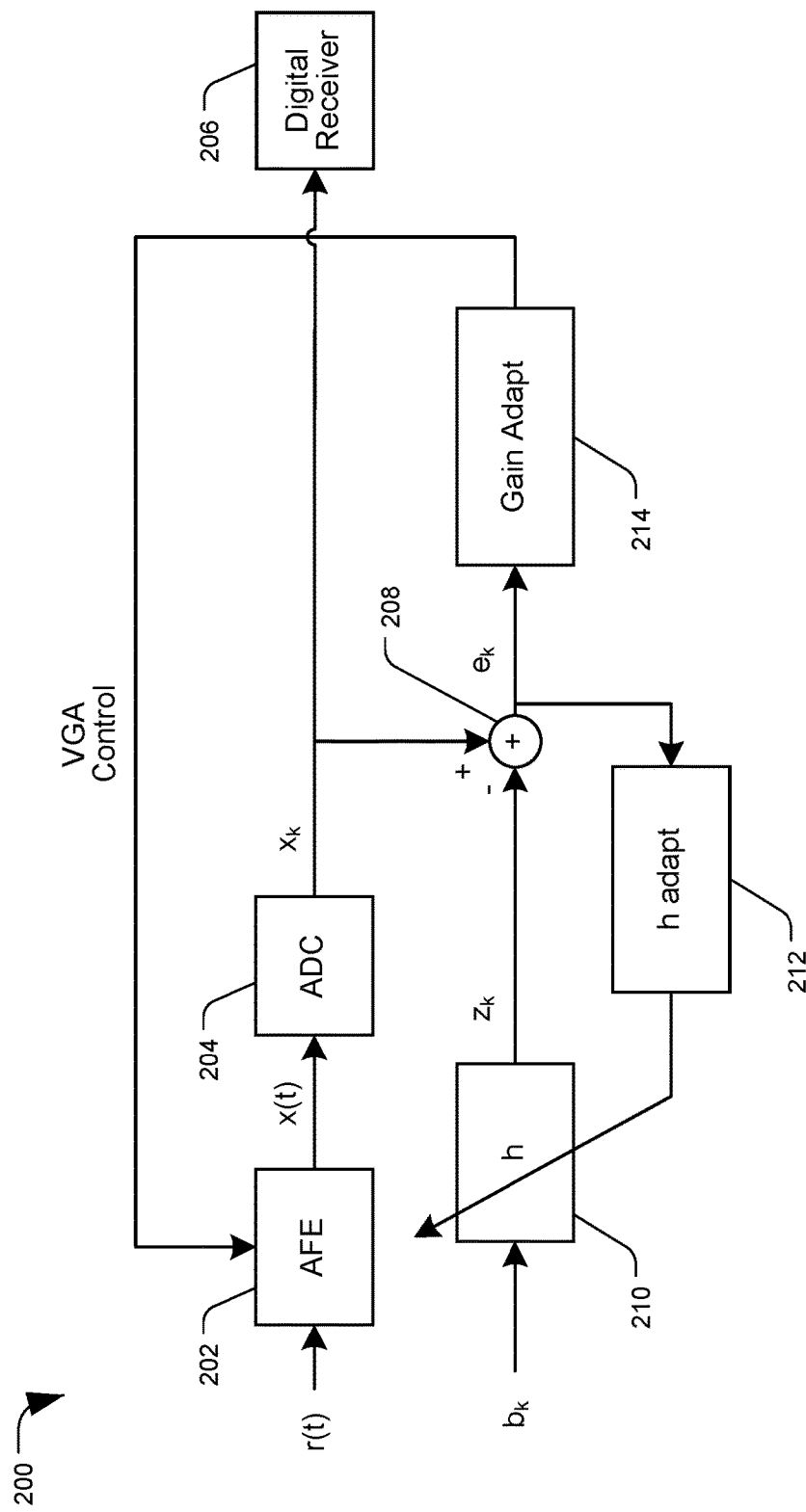
FIG. 2 is a diagram of a system configured for data path dynamic range optimization, in accordance with certain embodiments of the present disclosure.

FIG. 2 is a diagram of a portion of a system configured for data path dynamic range optimization, generally designated 200, in accordance with certain embodiments of the present disclosure. The system 200 may include components from a data channel, such as the R/W channel 108 of FIG. 1.

In the depicted example, a signal r(t) may be received at a channel for processing, such as from a read head of a storage device. The signal r(t) may undergo continuous-time signal processing at an analog front-end (AFE) circuit 202, outputting the processed analog signal x(t). The processed signal x(t) may be converted to a digitized sample sequence $x_k$ by an analog-to-digital converter (ADC) circuit 204. The digital sample sequence $x_k$ may be sent down the channel to a digital receiver 206, which may determine a sequence of data bits based on the samples. As a note on the signals discussed herein, a waveform, in general, may be continuous-time (e.g. often denoted by x(t) or the like for a signal value at a given time "t") or discrete time (e.g. often denoted by $x_k$ or x(k) for a signal value of a given sample "k"). Either may be referred to as a signal or a "waveform", but the discrete time signal can also be referred to as a sample sequence.

The ADC 204 may have a fixed amplitude range that it accepts at its input. For example, the ADC 204 may have a 200 millivolt (mV) input amplitude range, peak-to-peak, from a minimum value of −100 mV to a maximum value of 100 mV. The input range that a component accepts may be referred to as its dynamic range. The signal x(t) may therefore have an optimum amplitude range to fully utilize the dynamic range of the ADC 204. Quantization may occur if the amplitude range of x(t) was 100 mV, which would only use half the ADC's range, or 50 millivolts, which would only use a quarter of the ADC's range. Conversely, saturation may occur if the amplitude range of x(t) was 300 mV, which may result portions of the signal being "clipped off" (e.g. the tops or bottoms of the signal waveform may be lost). The ADC 204 my directly map values of x(t) within its input range to the output range of $x_k$, so that properly setting the range of x(t) at the AFE 202 may set the range of $x_k$.

As an example, the ADC 204 may be a 6-bit ADC with a 200 mV input range. The ADC 204 may map an input voltage to a digitized value. The 6-bit ADC 204 may map voltages to digital values from, e.g. −31 to +31, with the 200 mV range being divided up approximately so that an input voltage from:

−100 mV to −96.875 mV maps to −31

. . .

−6.25 mV to −3.125 mV maps to −1

−3.125 mV to 3.125 mV maps to 0

3.125 mV to 6.25 mV maps to 1

. . .

96.875 mV to 100 mV maps to 31.

The ADC 204 may act as a pass-through element that converts millivolts into a number of least significant bits (LSBs) or a value range. So after passing through the ADC 204, the range of the signal x(k) may be −31 to +31, which, excluding quantization and saturation, may be synonymous with the input millivolt range, and may be the same range expressed in different units. If the range of the signal x(t) is set to less than the full input range of the ADC 204, it may be suboptimal since some values will never appear and granularity may be lost. If the range of the signal is set higher than the input range of the ADC 204, then any voltage values greater than, e.g. 96.875 mV may be categorized into digital value 31, even if the voltage was as high as, e.g. 300 mV, effectively "clipping off" a large portion of the signal. In general, applying a signal slightly in excess of the ADC 204 input range (e.g. −110 mV to 110 mV) may be optimal since it would provide some extra resolution around 0 mV, which can be an important range, and because having good resolution for large input voltages may not be as important. Therefore, the optimum amplitude range of the signal may be a value that would be most effective for the purposes of the receiving component based on that component's input range. Fully utilizing the input range of a component of the data path may include setting the amplitude of the signal to approximately match the input range of the component, or may include setting the signal amplitude slightly lower or higher than the input range of the component, in some example embodiments.

Therefore, the conditioning process at the AFE 202 can set the amplitude range of x(t) so as to fully utilize the ADC 204 dynamic range and avoid degradation of the signal and the channel's performance. To accomplish the appropriate amplitude scaling, a variable gain amplifier (VGA) control signal may be applied to the AFE 202, which may provide the AFE with a multiplier with which to scale the signal r(t) up for a larger amplitude, or down for a smaller amplitude of x(t).

Although the VGA control value may be selected in a number of ways, an example method is described in regard to FIG. 2. The VGA control value may be generated by a gain adaptation circuit or module 214, based on an error signal $e_k$. The error signal $e_k$ may be generated at a summing node, junction, or circuit 208 based on a difference between the sample sequence $x_k$ and an expected (e.g. noiseless) waveform a from a channel pulse response estimate or filter "h" 210. As used herein, filters may be modules that perform signal processing functions (e.g. "filtering") to reduce or enhance elements of a signal, such as adjusting the signal's amplitude range. The filters may include coefficients applied in mathematical operations to filter the signal, and adjusting the coefficients can be used to adjust properties of the filtered signal. The filter h 210 may generate the expected waveform a based on an underlying or expected bit sequence $b_k$. The bit sequence $b_k$ may come from a variety of sources, such as a detector of the data channel, or a known bit sequence if known data is written to the storage media being read.

As stated, the error signal $e_k$ may be provided to the gain adaptation circuit 214, and may also be provided to an h adaptation module or circuit 212, which may adapt the parameters or coefficients of h 210 based on the error signal $e_k$. The adaptation of the system 200 may be considered joint between h 210 and the VGA control in that they interact through and are both adapted based on the error generation of $e_k$. Accordingly, the adaptation via gain adapt 214 and h adapt 212 may operate to select the dynamic range of the noiseless signal $z_k$ and of the sampled data sequence $x_k$. If $x_k$ and $z_k$ are not fully matched, the resulting error values $e_k$ be excessively large and, thus, the system may adapt to make $x_k$ and $z_k$ match by increasing the gain via the VGA control or decreasing the coefficients at h 210.

An example implementation of generating the error signal $e_k$ may be expressed as:

$$e_k = x_k - z_k \quad (1)$$

$$= x_k - \sum_{i=-L}^{L} h_k^i \times b_{k-i},$$

where $x_k$ may be a linear function of the VGA gain (e.g. $x_k \approx g_k \times r(kT)$, where $g_k$ may be the VGA gain applied by the AFE 202 based on the VGA control signal, and r(kT) may be the sampled input waveform). If minimization of the expected squared error is desired, a least-mean square (LMS) adaptation procedure may be utilized. Here the gradients can be generated as the derivative of the squared error with respect to the VGA control gain and the pulse response filter h 210 coefficients as, $$\nabla_{g_k} = e_k \times r(kT)$$

$$\nabla_{h_k^i} = -e_k \times b_{k-i}. \quad (2)$$

In the top equation in (2), as r(t) is never sampled, the value of r(kT) may not be known. The lack of knowledge of the sampled input waveform r(kT) can be addressed by approximating it using the corresponding ADC 204 sample ($x_k$), which may be acceptable to within a scale factor for a static VGA gain. This is because the continuous-time signal r(t) may be scaled by the VGA gain $g_k$ at the AFE 202 (e.g. $x(t)=g_k*r(t)$), and sampled by the ADC 204 at time kT (e.g. $x_k=x(kT)$). Substituting these values provides $x_k=x(kT)=g_k*r(kT)$. These gradients can be generated and utilized to update each parameter as, $$g_{k+1} = g_k + \mu \times \nabla_{g_k}$$

$$h_{k+1}^i = h_k^i + \mu \times \nabla_{h_k^i}, \quad (3)$$

where μ is the adaptation step-size. The gain gradient may be generated by the gain adapt module 214 and used to adapt the VGA control sent to the AFE 202 to adapt $x_k$, and the h gradient may be generated by the h adapt module 212 and used to adapt the h filter 210 to adapt $z_k$.

When the described joint adaptation of filter h 210 and VGA control is implemented, it should be done in a manner that avoids the degenerate solution in which all parameters converge to zero. By setting the VGA gain at the AFE 202 to zero and all coefficients of h 210 to zero, the resulting error $e_k$ will also be zero, which may not be particularly useful and, thus, should be avoided. Avoiding this solution may be done in different ways; however, the examples provided herein may focus on any method which constrains the pulse response estimate h 210 so as to fix the dynamic range of $z_k$. For example, one method to accomplish this may be by adapting a single or selected coefficient of the pulse response filter h 210 so as to fix the absolute sum of the coefficients of h 210 to a selected constant value (K). Since the bits $b_k$ applied to the h filter 210 may be in {−1, +1}, this absolute sum of the coefficients may represent the largest potential positive and negative values generated by this convolution and, thus, may set the dynamic range of $z_k$. For example, if the absolute sum of the coefficients K is set to 6, the largest potential positive value of a may be +6, while the largest potential negative value may be −6. In general, the maximum positive value of a may be obtained when the sign of the bits $b_k$ is equal to the sign of the coefficients of h 210, and the maximum negative value when they are not equal.

Since the joint adaptation acts to minimize the error sequence $e_k$ (e.g. the expected squared error between $z_k$ and $x_k$), the gain adapt 214 and the pulse response filter h 210 may jointly adapt to match $x_k$ to $z_k$ and, thus, also (approximately) sets the dynamic range of $x_k$ to K. In this way, K may be selected to ensure that the entire dynamic range of the ADC 204 is fully utilized. Although the selection of the absolute sum K of the coefficients of h 201 was provided as an example, any such method which allows for a selection of the dynamic range of the digitized sequence $x_k$ may also be considered in the context of this disclosure.

The foregoing examples provided methods for scaling a signal being applied to an ADC 204 using the joint adaptation of a pulse response filter h 210 and a VGA control value via a gain adapt module 214, in order to select the dynamic range of the output of the ADC 202. Although this concept may be important to ensure that performance is not lost through ADC 204 sampling, signal scaling throughout the remainder of the data-path can also be controlled for similar reasons. For example, depending on the application, data-paths for digital receivers may be quite complex, consisting of numerous filters, used both in cascade and in parallel operation, as well as other forms of processing and signal combining. In addition, the number of bits utilized at each point in the data-path may be generally constrained and may vary from block to block. Ensuring a fully utilized data-path, therefore, may not be a straightforward procedure. The application of joint adaptation to constrain dynamic ranges of signals throughout a data-path is addressed in further detail in regard to FIG. 3.

Figure 3:
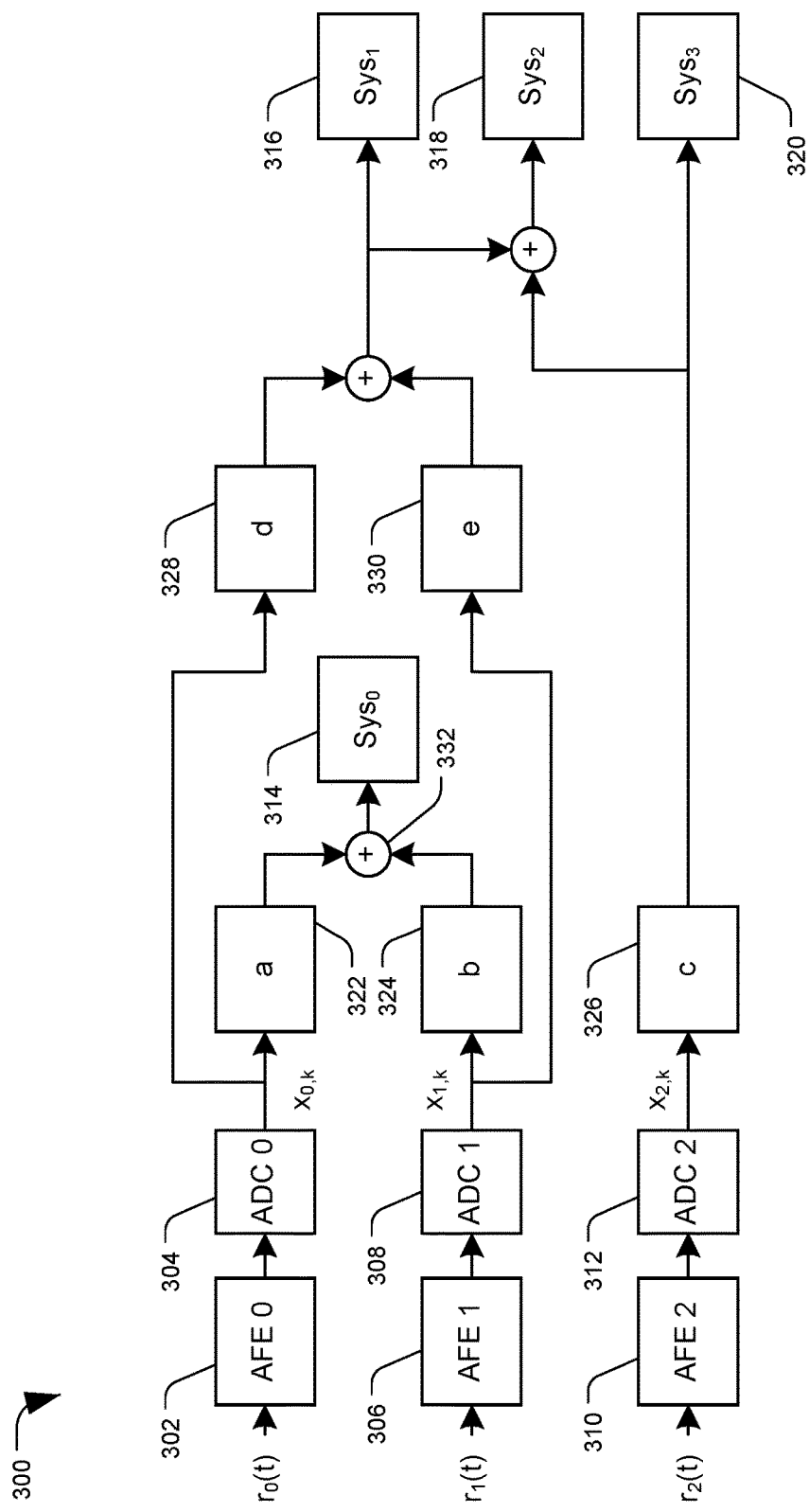
FIG. 3 is a diagram of a system configured for data path dynamic range optimization, in accordance with certain embodiments of the present disclosure.

FIG. 3 is a diagram of a system configured for data path dynamic range optimization, generally designated 300, in accordance with certain embodiments of the present disclosure. The system 300 may include components from a data channel, such as the R/W channel 108 of FIG. 1.

A simple complexity data-path may include a single ADC and digital filter followed by a detector, and therefore utilizing the full dynamic range of an ADC output and digital filter output may be accomplished with, e.g. adding a single constraint, such as the joint adaptation h filter with absolute sum coefficient K as discussed in regard to FIG. 2. For more complex data-paths, such as those which may arise, for example, in multi-antenna wireless systems or in hard-disk drives employing multi-sensor read heads (a technology referred to as Multi-Sensor Magnetic Recording (MSMR)), fully utilizing the dynamic range of the data-path may be non-trivial. In such systems, multiple signals may be received, each of which may be processed, sampled, and (potentially) combined in a digital receiver. System 300 may be an example of such a multiple receiver complex data channel.

In system 300, three continuous-time signals $r_0(t)$, $r_1(t)$, and $r_2(t)$, may be received and processed at respective AFE 0 302 and ADC 0 304, AFE 1 306 and ADC 1 308, and AFE 2 310 and ADC 2 312. The three signals may be sampled to generate digital sample sequences $x_{0,k}$, $x_{1,k}$, and $x_{2,k}$, respectively. These digitized sequences may then be processed by a number of digital filtering operations or circuits, such as filter a 322, filter b 324, filter c 326, filter d 328, and filter e 330, to produce linear transforms of the digital sample sequences. The filters may be configured to adjust or adapt an amplitude of a sample sequence processed by the filters. The outputs of the filters a through e may then be combined at various locations along the data-path and applied as inputs to four digital subsystems $Sys_0$ 314, $Sys_1$ 316, $Sys_2$ 318, and $Sys_3$ 320. For example, the outputs of filters a 322 and b 324 may be combined at summing node 332 to generate a combined signal at the summing node output, which combined signal may be provided to $Sys_0$ 314.

As shown, $Sys_0$ 314 and $Sys_1$ 316 may receive linear transforms of $x_{0,k}$ and $x_{1,k}$, $Sys_2$ 318 may receive a linear transform of $x_{0,k}$, $x_{1,k}$, and $x_{2,k}$, and $Sys_3$ 320 may receive a linear transform of $x_{2,k}$. The systems $Sys_0$ 314, $Sys_1$ 316, $Sys_2$ 318, and $Sys_3$ 320 may include complex signal processing operations or circuits (e.g. differentiated from simple operations such as filters or multipliers, combination logic, delay lines, etc). Sys elements may include detection algorithms, decoding algorithms, acquisition logic, any other type of complex signal processing operations, or any combination thereof. To avoid degradation of these Sys processes, a methodology is proposed to maximally utilize the dynamic range at important points throughout the system 300. As discussed herein, a signal's dynamic range may be constrained, or "pinned", at any specific point in the data-path using a joint adaptation between a pulse response filter (e.g. filter h 210 of FIG. 2) and another filter used to impose the constraint (e.g. the AFE 202 of FIG. 2, with a note that a gain, such as that provided by the VGA of the AFE, may be a single tap filter). While constraining all points throughout the data path 300 may be an option to maximally utilize the data path's dynamic range, this may degrade system performance, and better results may be achieved by selecting appropriate points along a complex data-path at which to apply constraints. In some cases, the proposed methodology may include the addition of digital filters to the data-path 300 to impose the constraints. An example embodiment of applying constraints to multiple parallel filters is depicted in FIG. 4.

Figure 4:
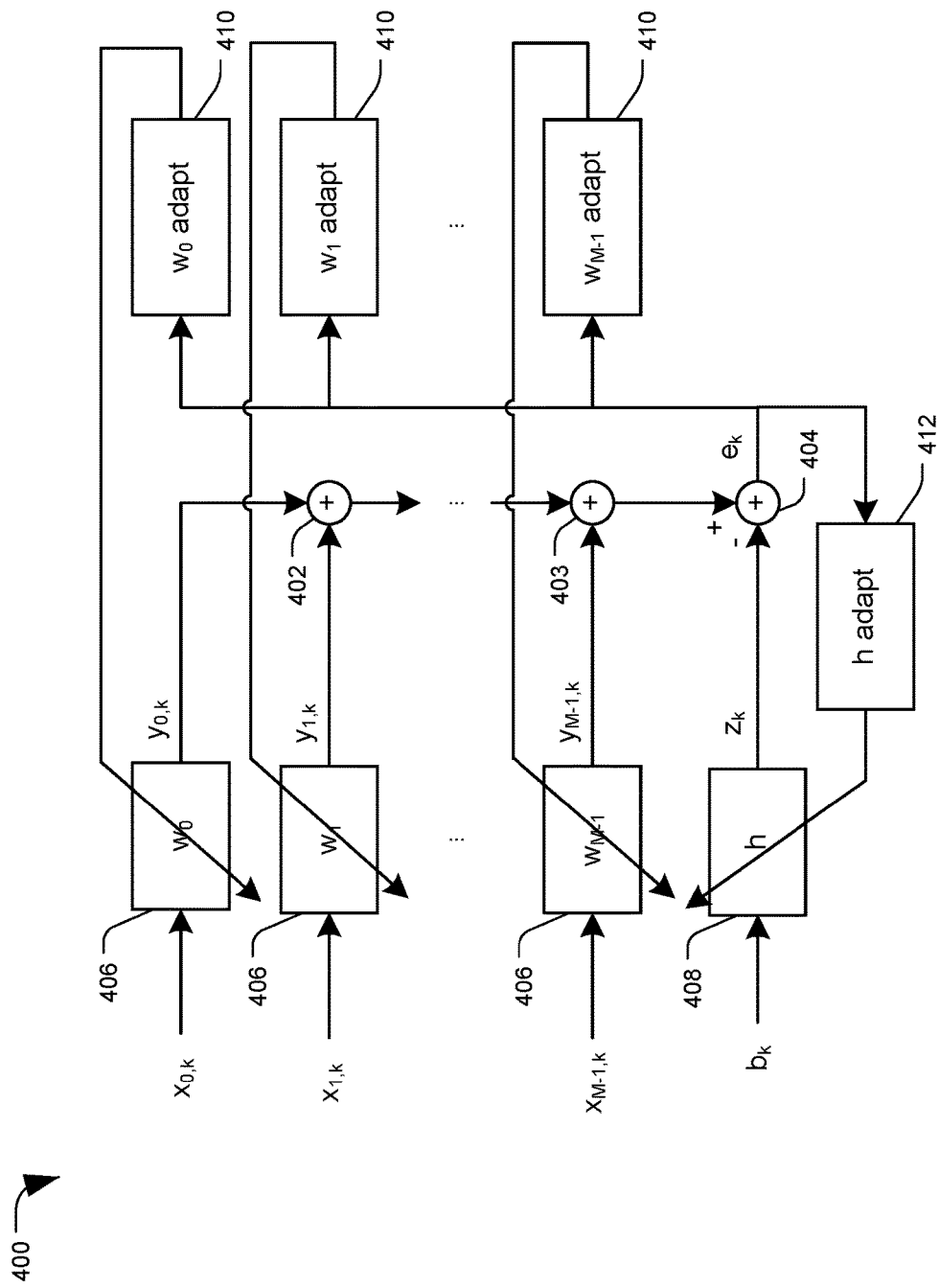
FIG. 4 is a diagram of a system configured for data path dynamic range optimization, in accordance with certain embodiments of the present disclosure.

FIG. 4 is a diagram of a system configured for data path dynamic range optimization, generally designated 400, in accordance with certain embodiments of the present disclosure. The system 400 may include components from a data channel, such as the R/W channel 108 of FIG. 1 or system 300 of FIG. 3.

System 400 shows an example in which the concepts of pinning a signal's dynamic range as described in regard to FIG. 2 is extended to include M parallel filters 406 ($w_0, w_1, \ldots, w_{M-1}$), the outputs of which may be summed at a series of summing nodes 402, with a final summing node 403 outputting the sum of all M $w_i$ filter outputs. An error signal $e_k$ may be generated based on the combined outputs of the M filters 406 and the output of a pulse response filter h 408 at an error signal generating summing node 404. The error signal $e_k$ may be used to jointly adapt the M parallel filters 406 via corresponding adapt modules 410, as well as the pulse response filter h 408 via the h adapt module 412.

The error generation may be expressed in terms of the M sequences of samples ($x_{0,k}, x_{1,k}, \ldots, x_{M-1,k}$), the bit sequence ($b_k$), and the coefficients of all filters 406 and 408 ($w_0, w_1, \ldots, w_{M-1}$, h) as:

$$e_k = \sum_{m=0}^{M-1} y_{m,k} - z_k \qquad (6)$$

$$= \sum_{m=0}^{M-1} \sum_{i=-N}^{N} w_k^{m,i} \times x_{k-i} - \sum_{i=-L}^{L} h_k^i \times b_{k-i},$$

yielding the gradients, $$\nabla_{w_k^{0,i}} = e_k \times x_{0,k-i} \qquad (7)$$

$$\nabla_{w_k^{1,i}} = e_k \times x_{1,k-i}$$

$$\vdots \quad \vdots \quad \vdots$$

$$\nabla_{w_k^{M-1,i}} = e_k \times x_{M-1,k-i}$$

$$\nabla_{h_k^i} = -e_k \times b_{k-1}.$$

Because the error generation can be conducted on the sum of the M filter 406 outputs, the joint adaptation here can act to pin the output of the final summing junction 403 to a given dynamic range, whereas the output of each of the M filters 406 may be completely unconstrained. This can be useful to the proposed methodology, as it allows the filters 406 to individually weight each signal path as the squared error dictates. For example, for the case of M=2, if signal $x_{0,k}$ is extremely noisy relative to $x_{1,k}$ then filters $w_0$ and $w_1$ can act to weight their relative contributions to the sum accordingly (e.g. weight down the contribution of $x_{0,k}$ to the sum relative to that of $x_{1,k}$). The ability of each of the parallel filters 406 to independently adjust its weight coefficients can be beneficial when signals and corresponding sample sequences ($x_{0,k}, x_{1,k}, \ldots, x_{M-1,k}$) exhibit transient behavior in which the individual contribution to square error may be changing over time and should be correspondingly tracked by filters 406 $w_0, \ldots, w_{M-1}$. The concept of constraining the summation of multiple filters while leaving the individual filters independently adaptable may be incorporated into the overall data-path range optimization methodology.

The constraints which can be used to pin a signal to a desired amplitude may be implemented via an adaptation circuit, which may be referred to as a filter adaptation module (FAM), via a process similar that described in regard to FIGS. 2 and 4. An example implementation of a FAM is described in regard to FIG. 5.

Figure 5:
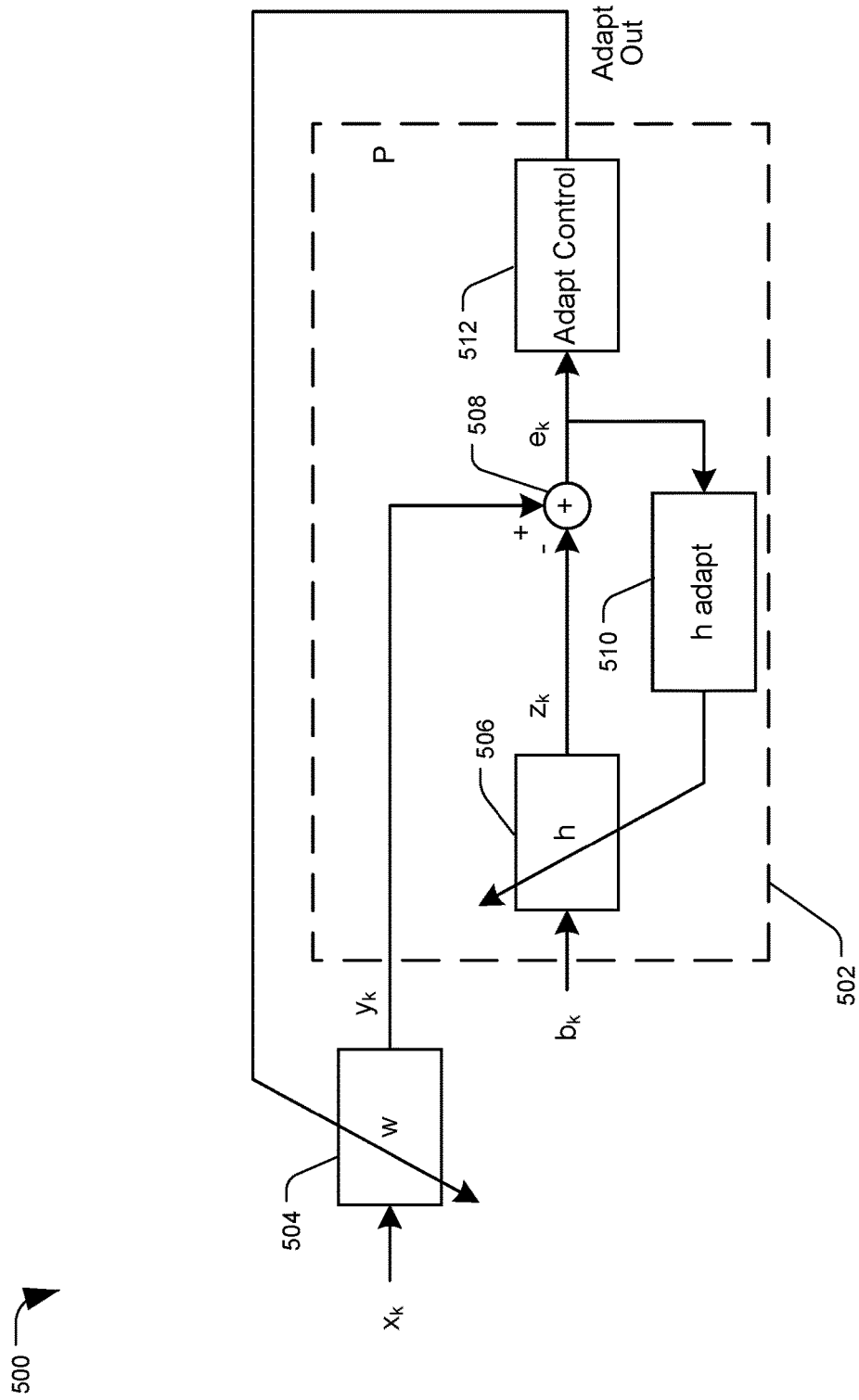
FIG. 5 is a diagram of a system configured for data path dynamic range optimization, in accordance with certain embodiments of the present disclosure.

FIG. 5 is a diagram of a system configured for data path dynamic range optimization, generally designated 500, in accordance with certain embodiments of the present disclosure. In particular, FIG. 5 depicts an example filter adaptation module (FAM) 502, such as the FAM 110 of FIG. 1, which may be incorporated into a data-path to pin a signal to a desired dynamic amplitude range.

The FAM 502, which may also be referred to herein as a P block, may apply joint adaptation techniques as described in regard to FIGS. 2 and 4. As shown, the input to the P block 502 may be a sequence of samples $y_k$ (which may be a linear transform of a sample sequence $x_k$) via a filter w 502, and the output may be an adaptation control applied to filter w 504 to apply a constraint. The P block 502 itself may include a pulse response filter h 506, which may generate a noiseless expected signal $z_k$ based on an estimated or known bit sequence $b_k$. An error signal $e_k$ may be generated at summation node 508 based on $y_k$ and $z_k$. The error signal may be provided to an h adaptation block 510 to adapt the pulse estimation filter h 506, as well as to the adapt control block 512 to generate the adapt out signal used to adapt the w filter 504. In certain embodiments, multiple adapt control blocks 512 may be included if the P block 502 is used to constrain the output from multiple filters w 504, such as was described in regard to FIG. 4.

The overall operation of the P block 502 may be to jointly adapt its contained pulse response filter h 506 along with another block (e.g. filter w 504), as specified by its adapt out control, so as to fix the dynamic range of its applied sample sequence ($y_k$). Example additions of P blocks 502 at various points along a data-path in order to constrain dynamic signal ranges at strategic points, according to the methodology proposed herein, are described in regard to FIGS. 6 through 10.

Figure 6:
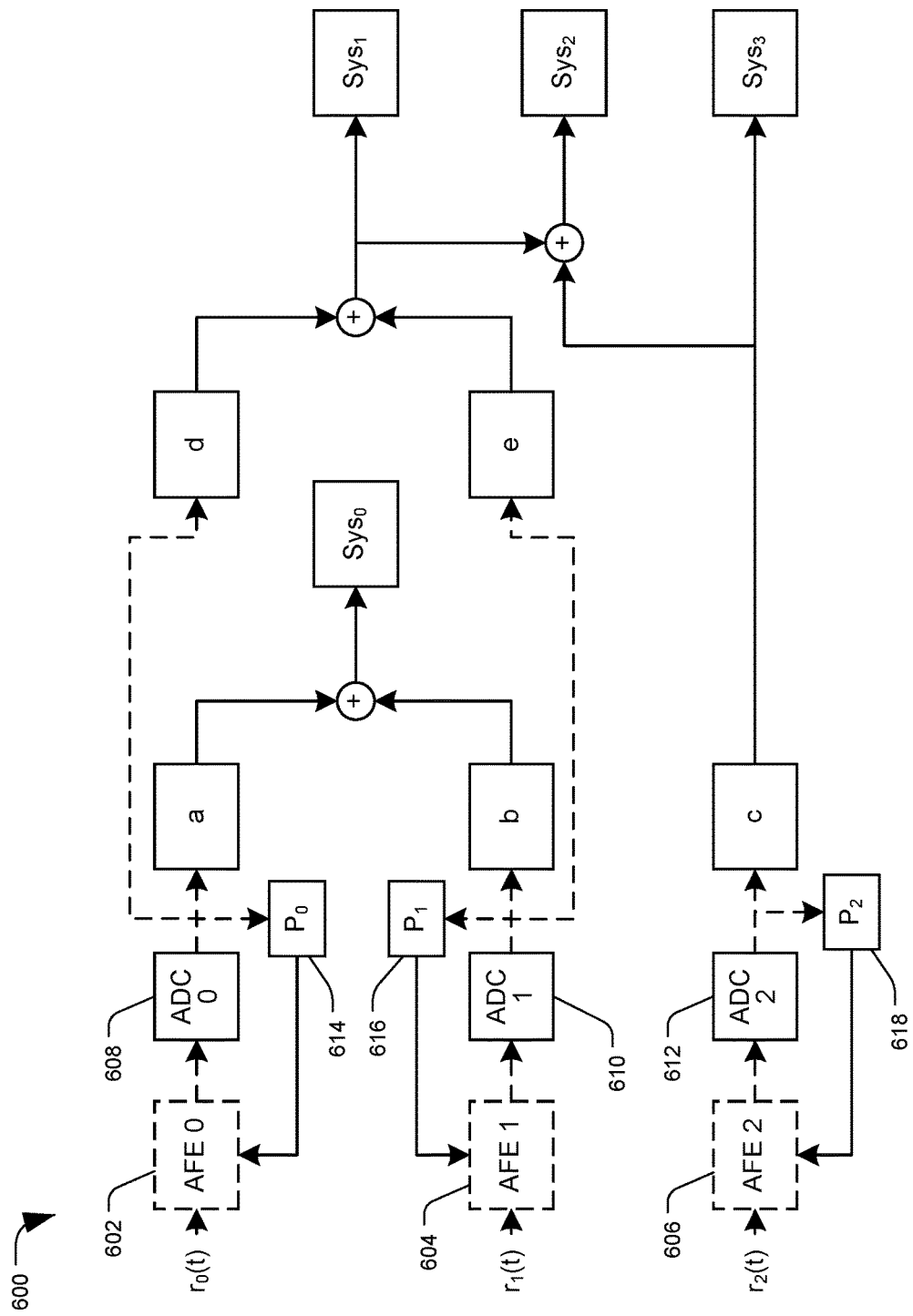
FIG. 6 is a diagram of a system configured for data path dynamic range optimization, in accordance with certain embodiments of the present disclosure.

FIG. 6 is a diagram of a system configured for data path dynamic range optimization, generally designated 600, in accordance with certain embodiments of the present disclosure. The system 600 may include components from a data channel, such as the R/W channel 108 of FIG. 1. In particular, system 600 depicts a system in which FAMs or P blocks are added at various strategic points to a system data path 600 in order to fully utilize a desired dynamic amplitude range for that portion of the data path 600.

An overview the proposed methodology will be provided here. One or more steps from the methodology may be implemented in a data-path to optimize utilization of the data-path's dynamic range at strategic positions, improving the overall performance of the channel. The methodology may be directed to the fact that a signal may be pinned to any desired amplitude at any point to maximally utilize the dynamic range. The methodology may include the following proposals:

1) Add a P block at the output of each ADC with the Adapt Out signal applied to each AFEs respective VGA module.
2) For each summing junction for which the output of two or more filters is applied, add a P block at the summing junction output with the Adapt Out signal applied to all filters preceding the summing junction. These filters are not re-used for additional constraints.
3) For each summing junction for which one or more input does not contain a filter, or that filter is already involved in another constraint, add a filter for each such branch. The result should be that all incoming branches to the summing junction contain filters available for adding constraints such that rule 2) may be applied.
4) For any system that takes the output of a filter not already used in a constraint, add a P block with the Adapt Out signal applied to that filter.
5) For any system that takes a signal that is not constrained, and has no filter available to add a constraint, add a filter such that rule 4) may be applied.

The order of implementing or considering the proposals in the design of a data-path may be arbitrary, and may, e.g. be considered from the ADCs downstream, or from the systems upstream, or in another other order. Some proposals may be implemented while others may be discarded, or additional signal constraints may be added.

The methodology proposed herein may include the addition of constraints to the output of ADCs in the system (e.g. via adjusting gain at the AFEs, as the ADCs may perform direct mapping of voltage inputs to digitized sample value outputs) and to inputs to subsystems that do not already have an imposed constraint. Here, the former of these proposals may be to ensure that no loss is incurred through ADC sampling, and the latter to enforce an expected signal range into each subsystem. In scenarios in which there exist filters to impose such constraints (e.g. based on adapt out signals from P blocks), those filters can be utilized. When no such filters exists, filters may be added to the data-path to impose the constraints. For the filters, a single tap filter may be used (e.g. a multiplier value that may scale the signal amplitude up or down according to the selected multiplier), or longer filters may be used if spectral shaping is desired in addition to the signal scaling. Once a filter is utilized to impose one constraint, it may not be used to impose another, different constraint. In the event that multiple constraints are desired, additional filters and P blocks may be added such that all desired constraints may be imposed. In addition to constraints imposed to ADCs and before subsystems, the methodology may also include constraining the output of every summing junction, or selected summing junctions, as shown and described in regards to FIG. 4. Selectively imposing one or more of the described constraints can significantly improve the overall performance of a system. Applying all of these proposals throughout the data-path may provide superior results to piecemeal implementation.

Turning now to the exemplary embodiment of FIG. 6, a complex data channel 600 is depicted that receives three signals, $r_0(t)$, $r_1(t)$, and $r_2(t)$, at three corresponding AFEs, AFE 0 602, AFE 1 604, and AFE 2 606. The output from the AFEs is provided to three corresponding ADCs, ADC 0 608, ADC 1 610, and ADC 2 612. According to the first proposal of the methodology, for each received signal, constraints are imposed so as to fully utilize the range of the corresponding ADC. This may be accomplished through the addition of FAM P blocks, including $P_0$ 614, $P_1$ 616, and $P_2$ 618. Once a portion of the data path has been pinned, by way of setting coefficients at a filter based on the adaptation output from a P block, the pinned or constrained portions of the data path are depicted in FIG. 6 as dashed lines. Here, a sample sequence is applied to a P block from an ADC, which then applies a constraint to the AFE preceding the ADC, thereby pinning the dynamic range of the sample sequence before and after the ADC. The ADC may not modify the dynamic range of the sample sequence, and so the range may remained pinned even after the sample is processed by the ADC. Furthermore, the block used to enforce this constraint (e.g. the AFEs in this case) are also outlined using dashed lines to indicate that they are now involved in enforcing a constraint and, thus, cannot be used to impose another constraint.

Figure 7:
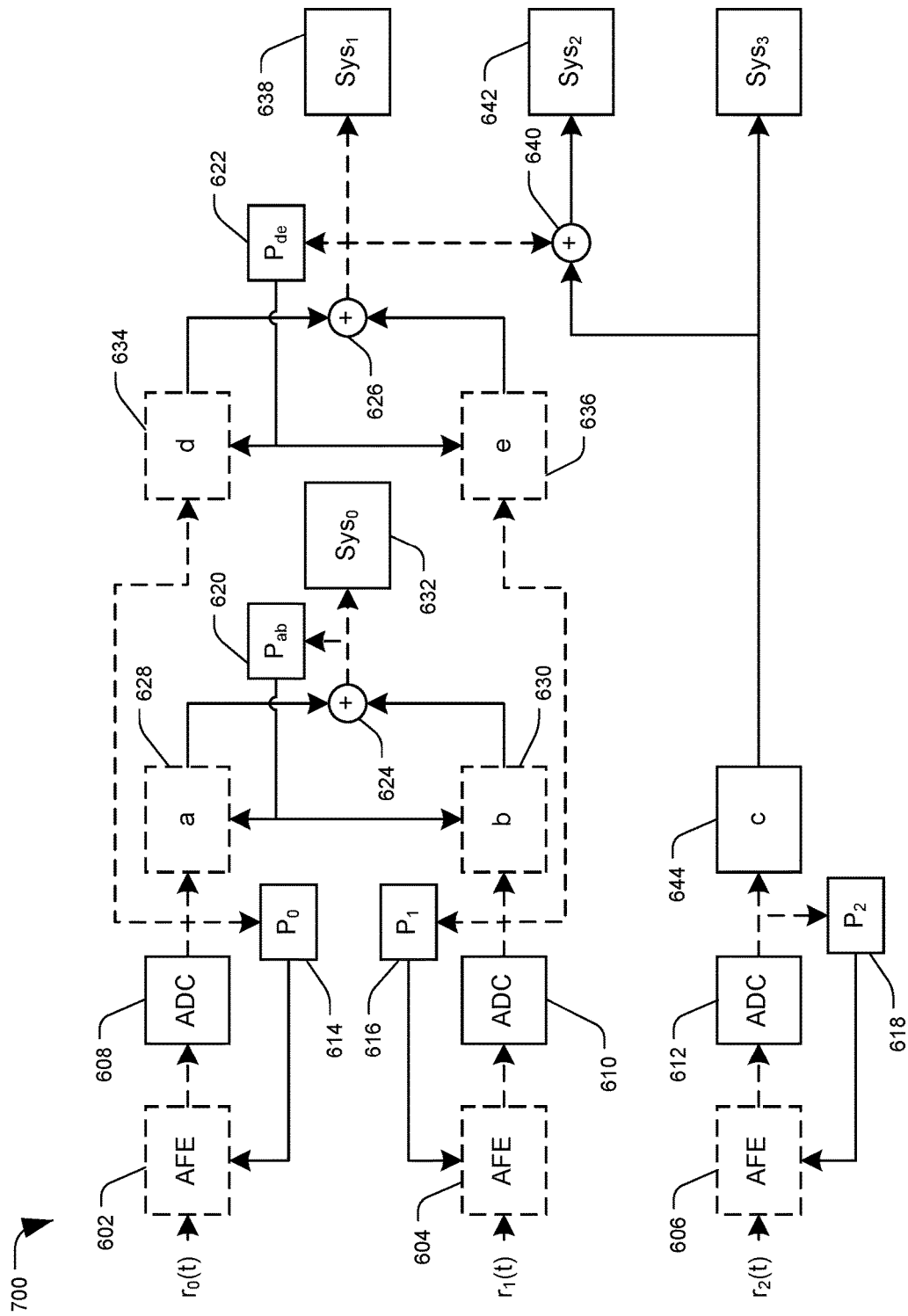
FIG. 7 is a diagram of a system configured for data path dynamic range optimization, in accordance with certain embodiments of the present disclosure.

Turning now to FIG. 7, a diagram of another potential embodiment of a system 700 for data path dynamic range optimization is shown, in accordance with certain embodiments of the present disclosure. The system 700 may be another example of the system 600 of FIG. 6, and accordingly corresponding elements may share the same numbers for simplicity.

In system 700, the proposal 1) has already been applied to constrain the dynamic range of the ADCs. Proposal 2) may be applied next, by adding P blocks, $P_{ab}$ 620 and $P_{de}$ 622 to the output of two summing nodes, summing node 624 and summing node 626, respectively. Summing node 624 can combine the outputs of filter a 628 and filter b 630 to generate the input to system $Sys_0$ 632. Summing node 626 can combine the outputs of filter d 634 and filter e 636 to generate the input to system $Sys_1$ 638. The P block $P_{ab}$ 620 may jointly adapt filters a 628 and b 630 in order to constrain the output from summing node 624, but may not directly constrain the outputs of either filter. Similarly, the P block $P_{de}$ 622 may adapt filters d 634 and e 636 in order to constrain the output from summing node 626, rather than the outputs of either filter. Not directly constraining the outputs of filters that output to summing junctions may be useful as it may allow the composition of the summing junction outputs to contain an arbitrary portion of each filter output (e.g. the input to $Sys_0$ 632 may contain anywhere from 100% filter a 628 output to 100% filter b 630 output, which would not be possible if the output ranges are fixed in size). Filters a 628, b 630, d 634, and e 636, as well as the outputs of summing nodes 624, 626 are now shown in dashed lines to indicate they have an existing constraint applied, and cannot support additional constraints.

Based on the above, is noted that proposal 2) has not been applied to summing junction 640 which generates the input to $Sys_2$ 642, as one of the inputs to summing node 640 does not have a filter capable of adding a constraint to the summing junction 640 output. For example filter c 644 may be used to constrain one input to summing node 640, but the other input comes from summing node 626, which is already constrained according to a different constraint from P block $P_{de}$ 622. This situation may be addressed as discussed in regard to FIG. 8.

Figure 8:
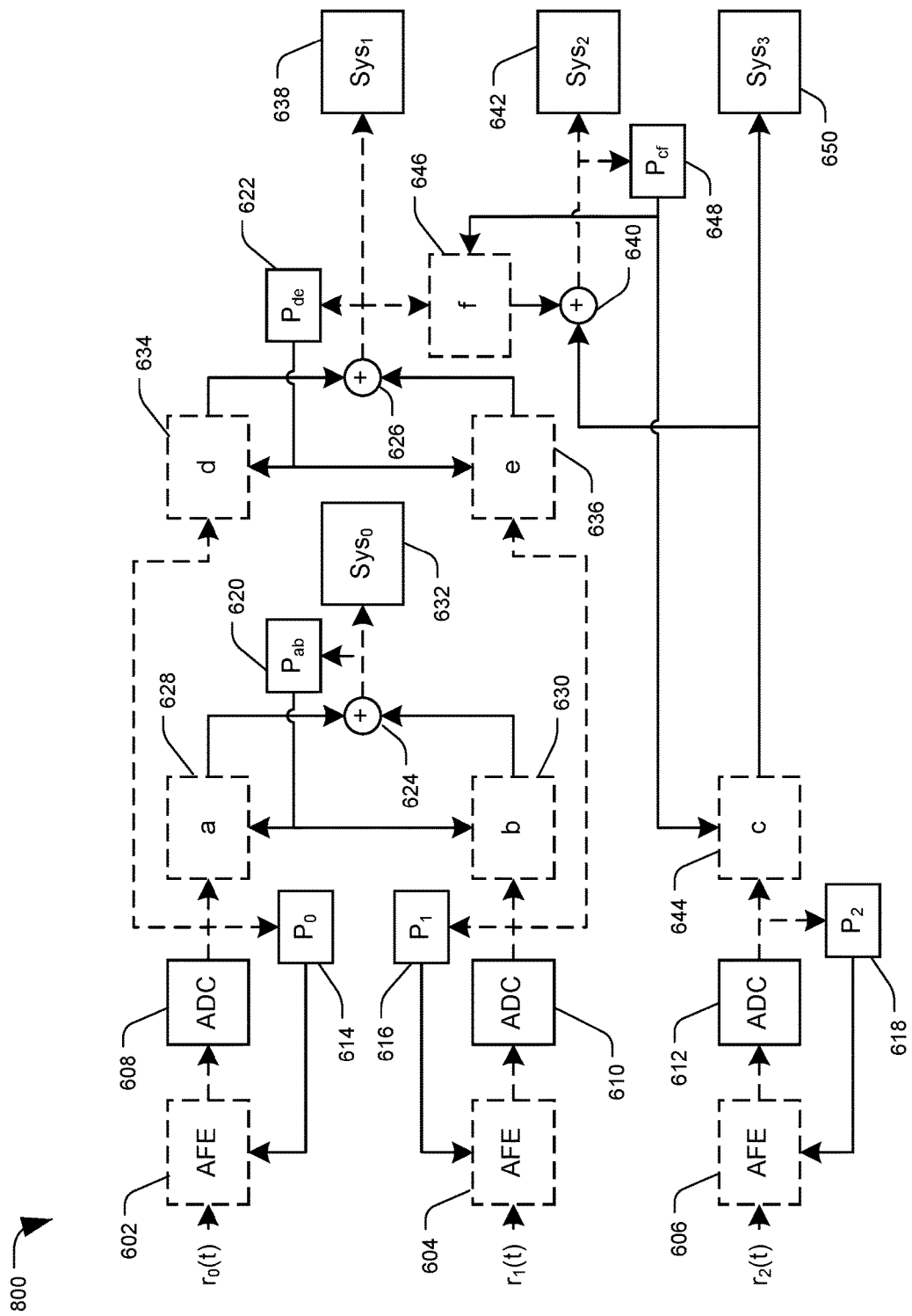
FIG. 8 is a diagram of a system configured for data path dynamic range optimization, in accordance with certain embodiments of the present disclosure.

FIG. 8 is a diagram of a system configured for data path dynamic range optimization, generally designated 800, in accordance with certain embodiments of the present disclosure. The system 800 may be another example of the system 600 of FIG. 6 or the system 700 of FIG. 7, and accordingly corresponding elements may share the same numbers for simplicity.

In order to address the situation that the output of summing node 640 cannot be constrained, proposal 3) may be used to add a filter f 646 between the output of summing node 626 and the input to summing node 640. In this manner, proposal 2) may be used to add P block $P_{cf}$ 648 to jointly constrain filters f 646 and c 644, and thus constrain the output of summing node 640 and the input to $Sys_2$ 642.

Figure 9:
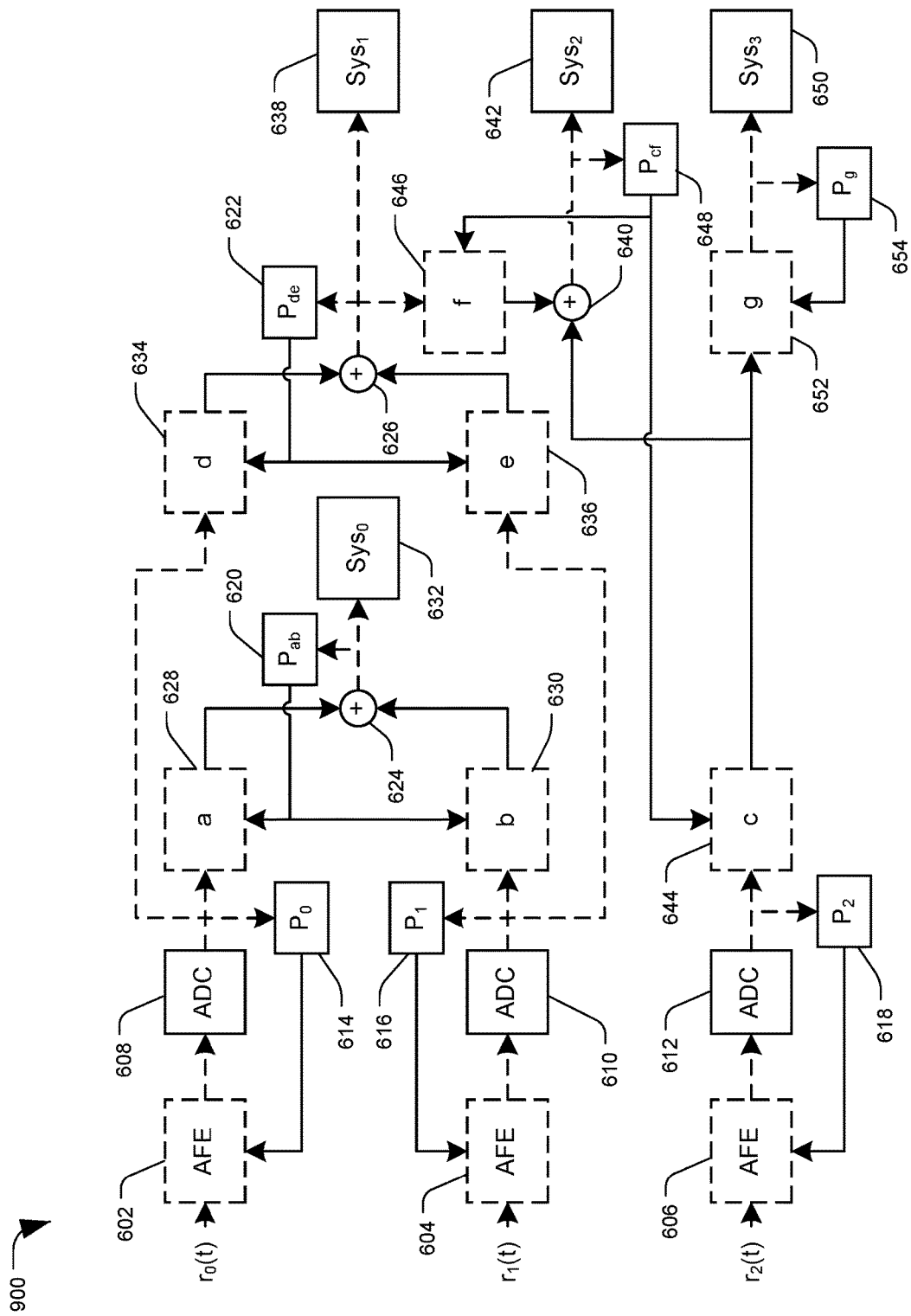
FIG. 9 is a diagram of a system configured for data path dynamic range optimization, in accordance with certain embodiments of the present disclosure.

The only remaining system for which the applied samples are not constrained is $Sys_3$ 650 which can be addressed in FIG. 9

FIG. 9 is a diagram of a system configured for data path dynamic range optimization, generally designated 900, in accordance with certain embodiments of the present disclosure. The system 900 may be another example of the systems of FIGS. 6 through 8, and accordingly corresponding elements may share the same numbers for simplicity.

In system 800 of FIG. 8, $Sys_3$ 650 was not constrained, and there was no filter capable of generating such a constraint that was not already committed to another constraint. Accordingly, in system 900, proposal 5) may be used to add filter g 652 before $Sys_3$ 650. Then proposal 4) may be used to add P block $P_g$ 654 to constrain filter g 652 and the input to $Sys_3$ 650. As shown, the input to all systems are now constrained and all of the five proposals have been applied to all locations of the data-path to which they would apply. In addition to the VGA control P blocks ($P_0$ 614, $P_1$ 616, and $P_2$ 618) to constrain the dynamic range of the ADCs, the proposed methodology included adding four P blocks ($P_{ab}$ 620, $P_{de}$ 622, $P_{cf}$ 648, and $P_g$ 654) and two filters (filter f 648 and filter g 652) to the data-path.

Although the examples of FIGS. 6 through 9 progressively added all the elements of the proposed methodology, it should be understood that systems may be design that only implement select proposals from the methodology and still fall within the scope of this disclosure. Further, the arrangement of FIG. 9 is not unique among cases in which all proposals are implemented, and the proposals may be applied in a different order or to produce different configurations than those depicted in FIGS. 6-9. An example alternate arrangement is proposed in FIG. 10.

Figure 10:
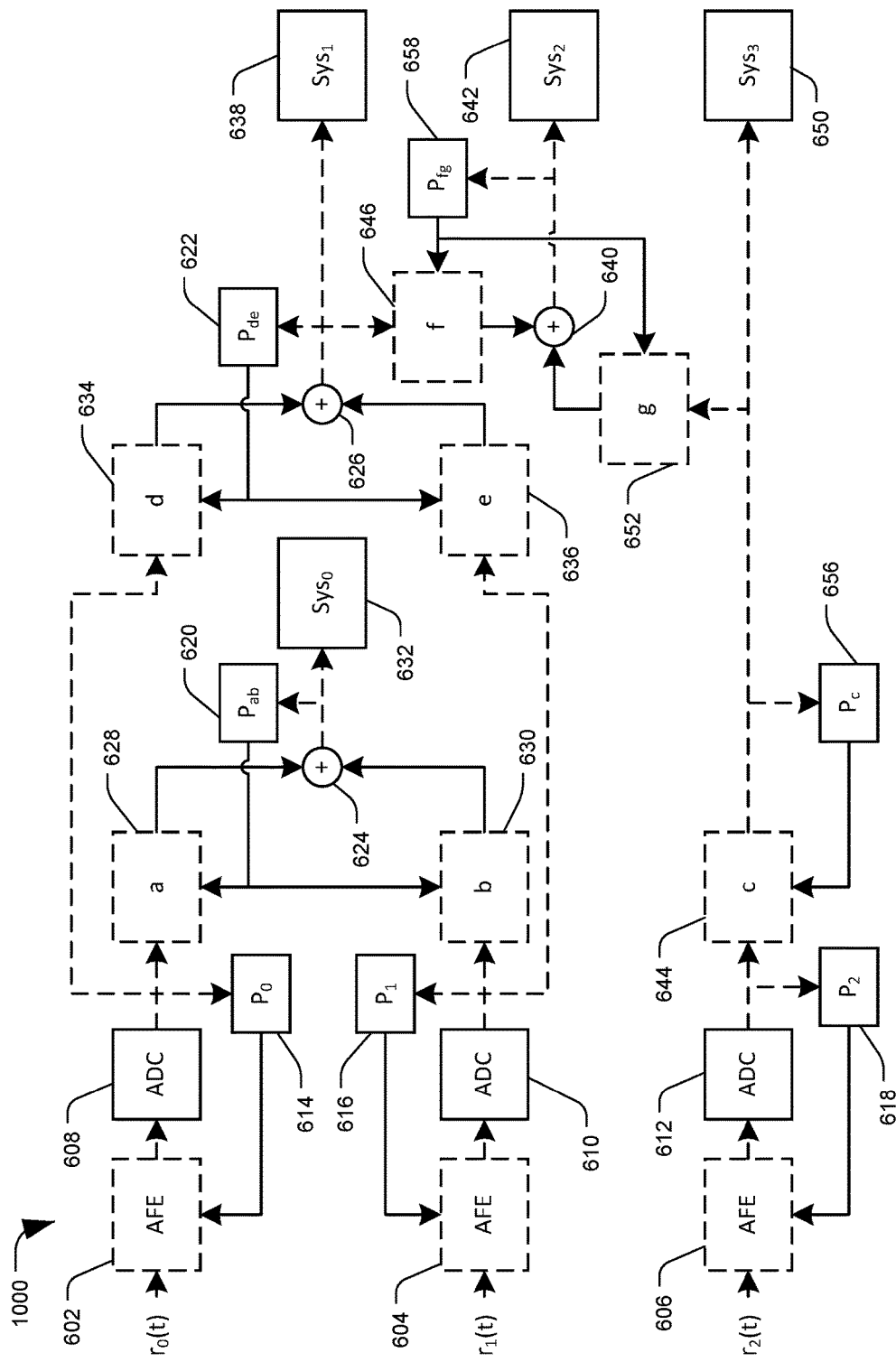
FIG. 10 is a diagram of a system configured for data path dynamic range optimization, in accordance with certain embodiments of the present disclosure.

FIG. 10 is a diagram of a system configured for data path dynamic range optimization, generally designated 1000, in accordance with certain embodiments of the present disclosure. The system 1000 may be another example of the systems of FIGS. 6 and 7, and accordingly corresponding elements may share the same numbers for simplicity.

The state of the system in FIG. 7 was that the input to $Sys_1$ 638 was constrained, but not the inputs to $Sys_2$ 642 and $Sys_3$ 650. Rather than jointly constraining filter c 644 and filter f 646 using P block $P_{cf}$ to constrain the input to $Sys_2$ 642 as in FIG. 8, instead proposal 4) may be applied to constrain filter c 644 to constrain the input to $Sys_3$ 650, as shown in FIG. 10. That is, in FIG. 10 filter c 644 may be individually constrained using P block $P_c$ 656 to correspond to the $Sys_3$ 650 input, instead of being jointly constrained to correspond to the $Sys_2$ 642 input as in FIGS. 8 and 9.

That would leave the input to $Sys_2$ 642 unconstrained, since the output of summing node 640 has not been constrained. Although both input paths to summing node 640 are already constrained (at filter c 644 and the output of summing node 626), those inputs are constrained for different systems. Therefore the output of the summing node 640 is not constrained, as there may be correlation between the input signals. For example, if the two inputs are of equal magnitude and opposite polarity, the output of the summing junction 640 would be zero. In the previous example of FIG. 8, adding filter f 646 and a P block $P_{cf}$ for filters f and c 644 allowed for constraining the input to Sys2 642; however, in this example, filter c 644 is already involved in a constraint and, thus, cannot be used. As such, proposal 3) may be applied to add filters f 646 and g 652 before the inputs to summing node 640, after which proposal 2) may be applied to add P block $P_{fg}$ 658 at the summing node 640 output to constrain both filters. In this manner, the input to $Sys_2$ 642 is also constrained.

The system depicted in FIG. 10 may be compared to the system in FIG. 9, each of which have data-paths constrained according to the proposed methodology and, thus, no additional rules remain to be applied. In both cases seven P blocks and two filters have been added to achieve this; however, the proposed rules were applied in a different order resulting in a different architecture of the data-paths. An example data storage device incorporating a read/write (R/W) channel configured for full utilization of a data path's dynamic range according to the proposed methodology is described in regard to FIG. 11.

Figure 11:
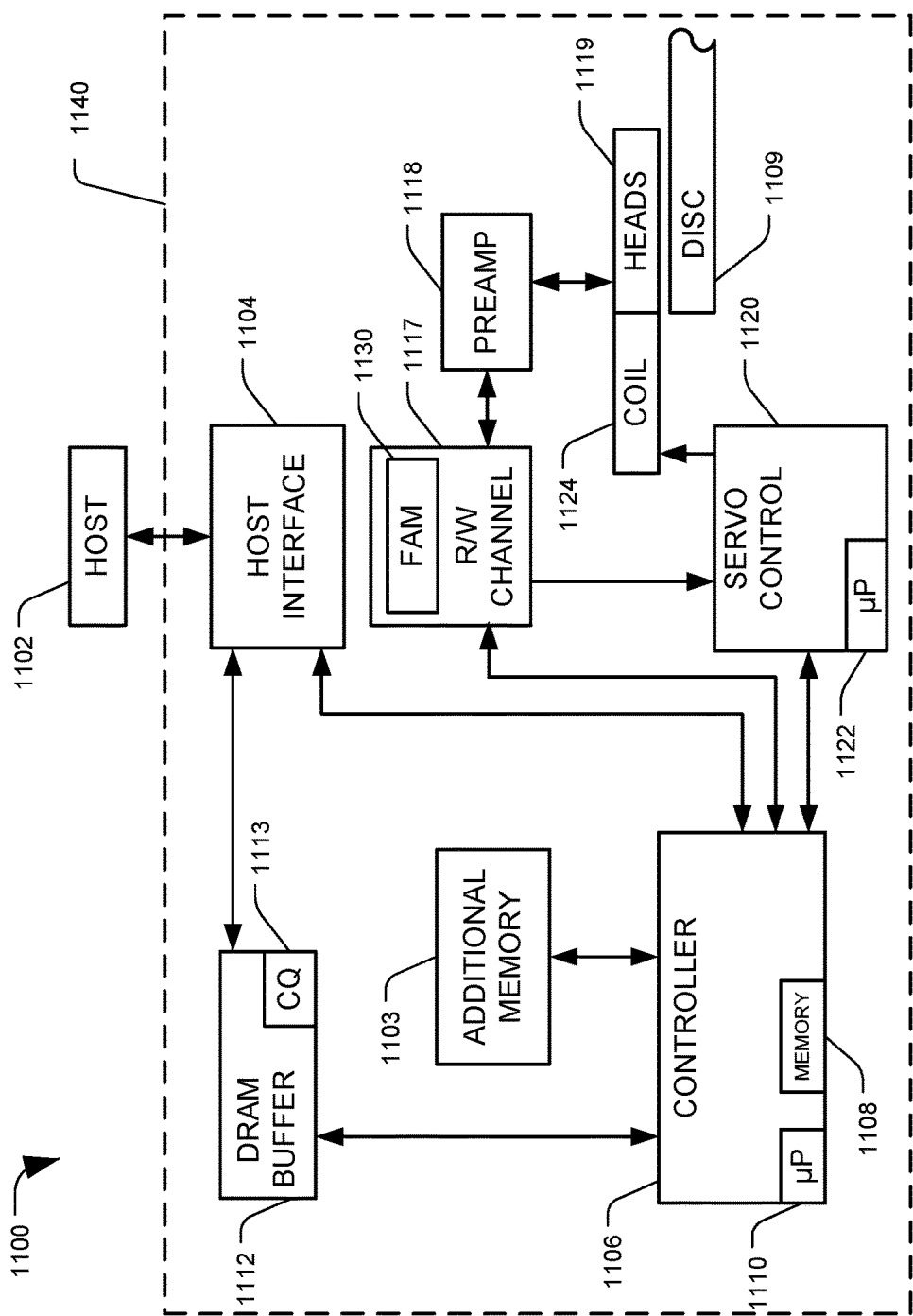
FIG. 11 is a diagram of a system configured for data path dynamic range optimization, in accordance with certain embodiments of the present disclosure.

FIG. 11 is a diagram of a system configured for data path dynamic range optimization, generally designated 1100, in accordance with certain embodiments of the present disclosure.

Specifically, FIG. 11 provides a functional block diagram of an example data storage device (DSD) 1100, which may be an example of the DSD 104 of FIG. 1. The DSD 1100 can communicate with a host device 1102 (such as the host system 102 shown in FIG. 1) via a hardware or firmware-based interface circuit 1104. The interface 1104 may comprise any interface that allows communication between a host 1102 and a DSD 1100, either wired or wireless, such as USB, IEEE 1394, Compact Flash, SATA, eSATA, PATA, SCSI, SAS, PCIe, Fibre Channel, Ethernet, or Thunderbolt, among others. The interface 1104 may include a connector (not shown) that allows the DSD 1100 to be physically removed from the host 1102. The DSD 1100 may have a casing 1140 housing the components of the DSD 1100, or the components of the DSD 1100 may be attached to the housing, or a combination thereof.

The buffer 1112 can temporarily store data during read and write operations, and can include a command queue (CQ) 1113 where multiple pending operations can be temporarily stored pending execution. Commands arriving over the interface 1104 may automatically be received in the CQ 1113 or may be stored there by controller 1106, interface 1104, or another component.

The DSD 1100 can include a programmable controller 1106, which can include associated memory 1108 and processor 1110. The controller 1106 may control data access operations, such as reads and writes, to one or more disc memories 1109. The DSD 1100 may include an additional memory 1103 instead of or in addition to disc memory 1109. For example, additional memory 1103 can be a solid state memory, which can be either volatile memory such as DRAM or SRAM, or non-volatile memory, such as NAND Flash memory. The additional memory 1103 can function as a cache and store recently or frequently read or written data, or data likely to be read soon. Additional memory 1103 may also function as main storage instead of or in addition to disc(s) 1109. A DSD 1100 containing multiple types of nonvolatile storage mediums, such as a disc(s) 1109 and Flash 1103, may be referred to as a hybrid storage device.

The DSD 1100 can include a read-write (R/W) channel 1117, which can encode data during write operations and reconstruct user data retrieved from a memory, such as disc(s) 1109, during read operations. A preamplifier circuit (preamp) 1118 can apply write currents to the heads 1119 and provides pre-amplification of read-back signals. In some embodiments, the preamp 1118 and heads 1119 may be considered part of the R/W channel 1117. A servo control circuit 1120 may use servo data to provide the appropriate current to the coil 1124, sometimes called a voice coil motor (VCM), to position the heads 1119 over a desired area of the disc(s) 1109. The controller 1106 can communicate with a processor 1122 to move the heads 1119 to the desired locations on the disc(s) 1109 during execution of various pending I/O commands in the command queue 1113.

DSD 1100 may include one or more filter adaptation modules (FAMs) 1130, for example in the R/W channel 1117, distributed among multiple components, as one or more stand-alone circuits, or any combination thereof. The FAM 1130 may perform the methods and processes described herein to constrain a dynamic amplitude range of a signal at strategic points through a data path such as the R/W channel 1117. For example, the FAM 1130 may include a P block as described herein configured to adapt a filter on the data path in order to adjust a signal amplitude and maximize the usage of the data path's range.

Although the foregoing examples provided herein are directed to R/W channels in a data storage device such as an MSMR disc memory device, the teachings are not limited thereto and can be applied to any data processing channel, and especially complex data channels. For example, the teachings may be applied to a device having multiple wireless signal antennae and a wireless signal processing channel configured to coherently combine the signals from the multiple antennae.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above embodiments, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:
1. An apparatus comprising:
   a circuit including:
      a first filter to digitally filter and output a first signal;
      a second filter to digitally filter and output a second signal;
      a summing node having:
         a first input to receive the first signal from the first filter;
         a second input to receive the second signal from the second filter;
         a summing node output;
         the summing node configured to combine the first signal and the second signal to generate a combined signal at the summing node output;
      a first adaptation circuit configured to:
         receive the combined signal; and
         filter the first signal and the second signal to set a dynamic amplitude range of the combined signal at the summing node output by modifying a first coefficient of the first filter and a second coefficient of the second filter based on the combined signal.

2. The apparatus of claim 1 further comprising:
the first adaptation circuit configured to set the dynamic amplitude range of the combined signal so that the combined signal utilizes approximately a full signal amplitude range of a data path at the summing node output, the full signal amplitude range being between a minimum amplitude value and maximum amplitude value accepted as input at a next system in the data path.

3. The apparatus of claim 2 comprising the circuit further including:
a first analog front end (AFE) configured to process the first signal;
a first analog to digital converter (ADC) configured to receive the first signal from the first AFE and to digitize the first signal before the first signal is received at the first filter; and
a second adaptation circuit configured to adapt the dynamic amplitude range of the first signal at the first ADC by adjusting a signal gain at the first AFE based on the first signal output from the first ADC.

4. The apparatus of claim 3 comprising the circuit further including:
a second AFE configured to process the second signal;
a second ADC configured to receive the second signal from the second AFE and to digitize the second signal before the second signal is received at the second filter; and
a third adaptation circuit configured to adapt the dynamic amplitude range of the second signal at the second ADC by adjusting a signal gain at the second AFE based on the second signal output from the second ADC.

5. The apparatus of claim 4 comprising the circuit further including:
a third filter configured to digitally filter and output a third signal;
a first signal processing system configured to process the third signal received from the third filter; and
a fourth adaptation circuit configured to adapt the third filter based on the third signal output from the third filter, so as to set the dynamic amplitude range of the third signal to utilize approximately a full signal amplitude range of the first signal processing system.

6. The apparatus of claim 5 further comprising the circuit includes a read channel of a data storage device.

7. The apparatus of claim 6 further comprising:
the data storage device, including a first reader and a second reader configured to simultaneously read from a single track of a data storage medium, the first reader generating the first signal and the second reader generating the second signal.

8. The apparatus of claim 7 comprising the circuit further including:
a plurality of signal processing systems including the first signal processing system; and
an adaptation circuit for each of the plurality of signal processing systems, each adaptation circuit configured to adapt at least one filter so that the dynamic amplitude range of each signal sent to the plurality of signal processing systems utilizes approximately a full signal amplitude range of the corresponding one of the plurality of signal processing systems.

9. The apparatus of claim 8 further comprising:
the second adaptation circuit including:
a first pulse response filter configured to generate a noiseless waveform for the first signal based on an expected bit sequence for the first signal;
the second adaptation circuit further configured to:
generate an error signal based on a difference between the first signal and the noiseless waveform; and
jointly adapt parameters of the first pulse response filter and the signal gain at the first AFE based on the error signal.

10. The apparatus of claim 9 further comprising:
the second adaptation circuit further configured to:
set an absolute sum of coefficients of the first pulse response filter to a selected constant value to set a dynamic range of the noiseless waveform; and
adapt the parameters of the first pulse response filter to make the dynamic amplitude range of the first signal approximately match the dynamic range of the noiseless waveform.

11. The apparatus of claim 1 further comprising:
the first filter includes an analog front end (AFE);
a digital to analog converter (ADC) configured to receive the first signal from the AFE and to digitize the first signal;
the first adaptation circuit including the second filter, the second filter including a pulse response filter configured to generate a noiseless waveform as the second signal based on an expected bit sequence for the first signal;
the first adaptation circuit further configured to:
set a dynamic amplitude range of the first signal at the ADC by adjusting a signal gain at first AFE based on the first signal output from the first ADC, including:
generate an error signal based on a difference between the first signal and the noiseless waveform; and
jointly adapt parameters of the pulse response filter and the signal gain at the AFE based on the error signal.

12. An apparatus comprising:
a data channel circuit including:
a first analog front end (AFE) configured to process a first signal;
a first analog to digital converter (ADC) configured to receive the first signal from the first AFE and to digitize the first signal;
a first adaptation circuit including:
a first pulse response filter configured to generate a noiseless waveform for the first signal based on an expected bit sequence for the first signal;
the first adaptation circuit configured to:
adapt a dynamic amplitude range of the first signal at the first ADC by adjusting a signal gain at the first AFE based on the first signal output from the first ADC, including:
generate an error signal based on a difference between the first signal and the noiseless waveform; and
jointly adapt parameters of the first pulse response filter and the signal gain at the first AFE based on the error signal.

13. The apparatus of claim 12 further comprising:
the first adaptation circuit further configured to:
set an absolute sum of coefficients of the first pulse response filter to a selected constant value to set a dynamic range of the noiseless waveform; and adapt the parameters of the first pulse response filter to make the dynamic amplitude range of the first signal approximately match the dynamic range of the noiseless waveform.

14. The apparatus of claim 12 comprising the data channel circuit further including:
   a second AFE configured to process a second signal;
   a second ADC configured to receive the second signal from the second AFE and to digitize the second signal; and
   a second adaptation circuit configured to adapt the dynamic amplitude range of the second signal at the second ADC by adjusting a signal gain at the second AFE based on the second signal output from the second ADC.

15. The apparatus of claim 14 further comprising the data channel circuit includes a read channel of a data storage device.

16. The apparatus of claim 15 further comprising:
   the data storage device, including a first reader and a second reader configured to simultaneously read from a single track of a data storage medium, the first reader generating the first signal and the second reader generating the second signal.

17. The apparatus of claim 12 comprising the data channel circuit further including:
   a first filter to adjust an amplitude of the first signal;
   a second filter to adjust an amplitude of a second signal;
   a summing node having:
      a first input to receive the first signal from the first filter;
      a second input to receive the second signal from the second filter;
      a summing node output;
      the summing node configured to combine the first signal and the second signal to generate a combined signal at the summing node output;
   a second adaptation circuit configured to:
      receive the combined signal; and
      filter the first signal and the second signal to set a dynamic amplitude range of the combined signal at the summing node output by modifying a first coefficient of the first filter and a second coefficient of the second filter based on the combined signal, without constraining signal amplitude between the first filter and the first input and between the second filter and the second input.

18. The apparatus of claim 14 further comprising:
   the second adaptation circuit configured to set the dynamic amplitude range of the combined signal so that the combined signal utilizes approximately a full signal amplitude range of a data path at the summing node output.

19. The apparatus of claim 18 comprising the data channel circuit further including:
   a third filter configured to digitally filter and output a third signal;
   a first signal processing system configured to process the third signal received from the third filter; and
   a third adaptation circuit configured to adapt the third filter based on the third signal output from the third filter, so as to set the dynamic amplitude range of the third signal to utilize approximately a full signal amplitude range of the first signal processing system.

20. The apparatus of claim 19 comprising the data channel circuit further including:
   a plurality of signal processing systems including the first signal processing system; and
   an adaptation circuit for each of the plurality of signal processing systems, each adaptation circuit configured to adapt at least one filter so that the dynamic amplitude range of each signal sent to the plurality of signal processing systems utilizes approximately a full signal amplitude range of the corresponding one of the plurality of signal processing systems.

* * * * *